(12) United States Patent  
Fürst et al.

(10) Patent No.: US 9,076,744 B2
(45) Date of Patent: Jul. 7, 2015

(54) ORGANIC-BASED ELECTRONIC COMPONENT CONTAINING PIXELS

(75) Inventors: Jens Fürst, Heßdorf (DE); Debora Henseler, Erlangen (DE); Hagen Klausmann, Germering (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1659 days.

(21) Appl. No.: 11/792,619

(22) PCT Filed: Dec. 5, 2005

(86) PCT No.: PCT/EP2005/056482
§ 371 (c)(1),
(2), (4) Date: Jun. 8, 2007

(87) PCT Pub. No.: WO2006/063952
PCT Pub. Date: Jun. 22, 2006

(65) Prior Publication Data
US 2008/0105943 A1 May 8, 2008

(30) Foreign Application Priority Data
Dec. 16, 2004 (DE) .......................... 10 2004 061 128

(51) Int. Cl.
*H01L 31/0224* (2006.01)
*H01L 27/32* (2006.01)
*H01L 27/12* (2006.01)
*H01L 27/30* (2006.01)
*H01L 51/42* (2006.01)

(52) U.S. Cl.
CPC .......... *H01L 27/3276* (2013.01); *H01L 27/124* (2013.01); *H01L 27/3244* (2013.01); *H01L 27/307* (2013.01); *H01L 51/42* (2013.01)

(58) Field of Classification Search
CPC .............. H01L 27/3244; H01L 27/124; H01L 27/3246
USPC ........................ 257/448, 222, 223, 229–231; 438/73–82
See application file for complete search history.

(56) References Cited

U.S. PATENT DOCUMENTS

| 4,202,000 A | * | 5/1980 | Carballes ........................ 257/85 |
| 6,326,230 B1 | | 12/2001 | Pain et al. |
| 6,628,355 B1 | * | 9/2003 | Takahara ...................... 349/106 |
| 7,105,999 B2 | * | 9/2006 | Park et al. ...................... 313/505 |
| 2003/0095094 A1 | * | 5/2003 | Goden .......................... 345/107 |
| 2004/0085598 A1 | | 5/2004 | Kokeguchi et al. |
| 2004/0178719 A1 | | 9/2004 | Sun |

FOREIGN PATENT DOCUMENTS

EP 1 478 212 A1 11/2004

* cited by examiner

*Primary Examiner* — Howard Weiss
*Assistant Examiner* — Tifney Skyles
(74) *Attorney, Agent, or Firm* — Staas & Halsey LLP

(57) ABSTRACT

The invention relates to an organic-based electronic component, especially a component with reduced pixel crosstalk. According to the invention, the crosstalk is reduced by a grid electrode.

12 Claims, 4 Drawing Sheets

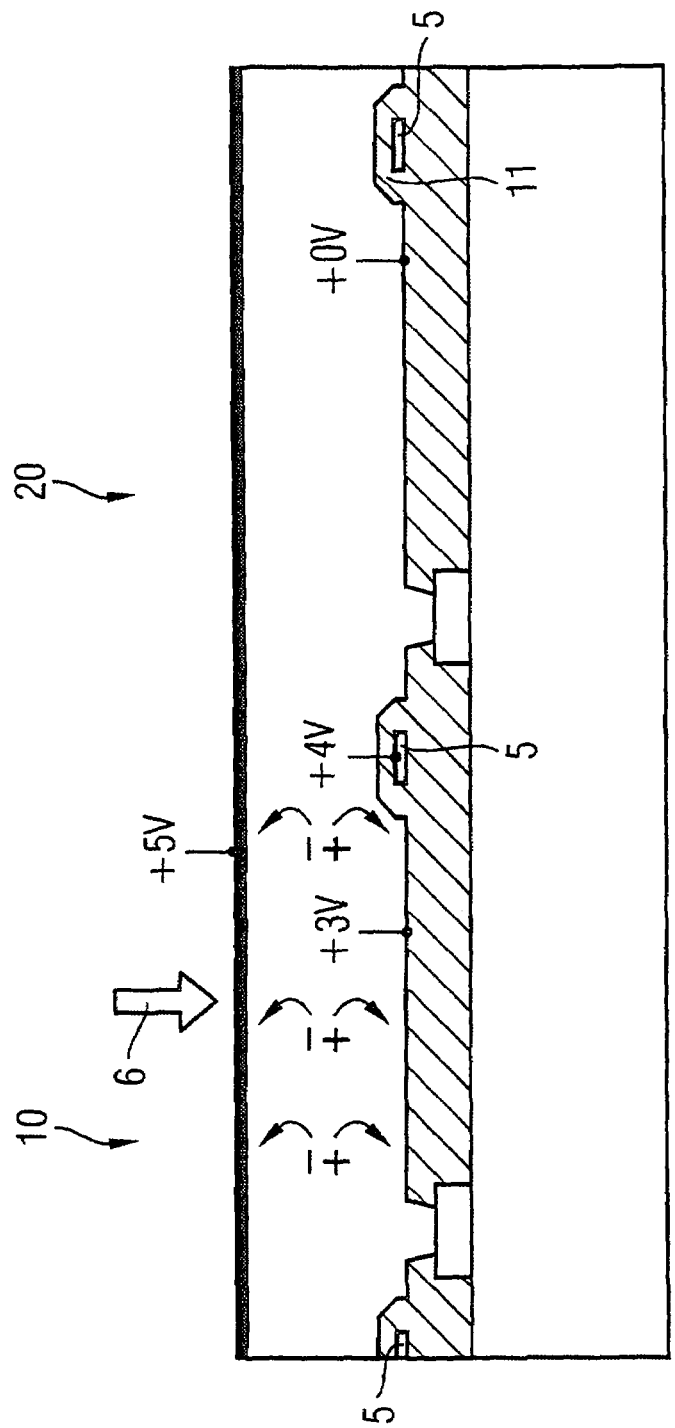

ORGANIC-BASED ELECTRONIC COMPONENT CONTAINING PIXELS

Figure 1:
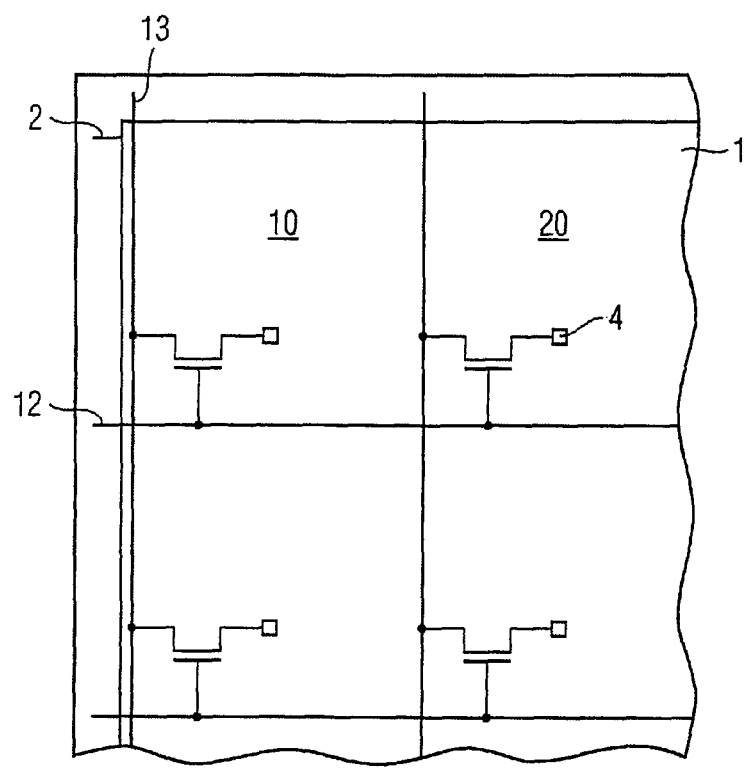

The invention relates to an organic-based electronic component, in particular to a component with reduced pixel crosstalk.

Organic-based electronic components are known for example in the form of photodiodes with organic semi-conductive, conductive and/or insulating materials and usually comprise at least one layer made from organic semi-conductive or conductive material which is divided into individual detector pixels and is embedded between two electrodes. During operation charge carrier pairs are produced in the active organic layer by light, the pairs subsequently separating, being conveyed through the active layer and released to the two opposing electrodes. Free charge carriers or charges are found in the layer in the process and, depending on the mobility of these charge carriers within the layer and on the potential ratios applied, these charges are not only purposefully conveyed to the next pixel electrode but are also conveyed transversely to this direction and along the layer. Pixels which should not be activated are activated thereby however and this results in signal crosstalk.

It should ideally be possible to individually trigger or activate the individual pixels, so that there is no smearing of a signal. This is a problem with large and inexpensively produced layers because a charge transfer into adjacent zones, to which no voltage is applied, simply cannot be avoided.

From an economic perspective these electronic components and for example the photodiodes are also of interest in the form of pixilated flat detectors where they may be produced in the visible range with high quantum efficiencies (50 to 85%) of the spectrum. The thin organic layer systems used in this connection can be inexpensively provided using known production methods such as spin coating, doctoring and/or printing methods and are accordingly of economic interest, primarily for photodiodes or other pixilated, organic electronic components with large areas. These layers may also be inexpensively provided because they are unstructured. Photodetectors produced in this way are used for example in medical image recognition as X-ray flat detectors since in this case the light of a scintillator layer is typically detected on relatively large areas of at least a few centimeters.

One drawback of the known systems is what is referred to as crosstalk because in the case of detector arrays with large, unstructured, organic semi-conductor layers crosstalk of the generated charges from the site of charge production to adjacent pixels is possible owing to the transverse conductivity within this layer. Typical conductivities of the active organic layers lie in the range of $10^{-4}$ to $10^{-6}$ S/cm. Simulation results show that with layer thicknesses in the region of a few hundred nanometers there can be strong discharging of charges into adjacent pixels hereby. The result is deterioration in spatial resolution, i.e. smearing of the detected image across a plurality of pixels.

The object of the invention is therefore to reduce crosstalk between pixels in the case of organic layers that are conductive all over.

This object is achieved by the subject matter of the claims and the description together with the figures.

The invention relates to an electronic component comprising at least one active, organic semi-conductive or conductive layer which is embedded between two electrodes, characterized in that within the layer system and laterally next to the pixilated electrodes an electrode in the form of a grid is placed over the entire active region, this grid electrode being coated with a passivation layer, defining individual or a plurality of pixels and being operated at a voltage which counteracts a charge transfer along the layer, in other words crosstalk of the individual pixels.

An organic photodetector, an electrochromic component, an organic light emitting diode and/or all types of displays or "flat panels" for example are designated electronic components that are made predominantly of organic material and comprising at least one semi-conductive or conductive layer. The solution to the stated object according to the invention is also used for example in an active matrix, such as an active matrix display and/or in a passive matrix, such as in a passive matrix display, or in similar devices.

In the case of an active matrix, as shown in the figures, a transistor, with which each pixel may be individually read-out, forms part of each pixel. The electrode connected to the transistor is structured in two directions (for example rectangular) to the pixel dimension, the other electrode is continuously plane. (The structured electrode can by all means also be the upper (top) electrode in this connection if the transistor is provided above the photodiode/light emitting diode or other active layer).

In contrast thereto the following component construction is called a passive matrix. The pixels are not individually switched but driven in a multiplex method (display) or read out (detector). For this purpose the two electrodes are strip-like and structured so as to be perpendicular to each other. The drawback of this construction lies substantially in the fact that with this display no stationary image is produced and instead there is only ever brief illumination of the pixels on the respectively active rows or in the detector. The light is thereby not integrated for the whole time between two cycles but only over the period in which a row is active.

The grid electrode can for example be provided by the following methods: vapor deposition, sputtering and/or known printing methods for applying conductive materials, for example as in the case of hot metal printing.

Structuring methods for the grid electrode layer are: lithographic structuring (preferably owing to high resolution), vapor deposition and/or sputtering by masking or structuring by printing methods (less expensive).

The cross-section of the grid electrode can substantially be round or ellipsoidal as well as substantially angular with an edge length.

The periodicity of the grid lies for example in the range of 50 to 500 µm.

The two electrodes are divided into top and bottom electrodes depending on the component.

"Pixilated" means that at least one of the active layers of the component is divided into pixels and in this document is the name for the structuring of a layer, so at least one active layer is divided into first regions or pixels which can be individually or jointly activated and so these first regions or pixels are defined by second regions which cannot be activated and form the boundary region between the pixels.

Various materials can be used as the top electrode, for example in the case of a photodiode metals such as Ba, Ca, Mg, Al, Ag and combinations or alloys of these metals, salts such as LiF or CsF or indium-tin oxide (ITO).

Various materials can be used as the bottom electrode, for example in the case of a photodiode indium-tin oxide or metals such as silver, chromium, palladium, platinum, gold, samarium, or combinations or alloys of such materials.

The affected conductive or semi-conductive layers made predominantly of organic material can for example comprise the following materials: fullerenes, fullerene derivatives, polyphenyl vinylenes, polythiophenes, polyfluorenes and mixtures (blends) of these material systems and derivatives or copolymers of these material classes.

The grid electrode can have a grid with the resolution of the pixels but it may also be wider meshed or can have different mesh sizes at different points of the layer.

The insulating coating of the grid can be made from the same material as the encapsulation of the component or the insulator layer and is used so that no charge carriers are lost at the grid electrodes, thus decreasing the intensity of the signal, and instead an electrically charged zone is only produced between the pixels by the passivated grid electrode, which zone prevents crosstalk or charge transfer between the pixels. It can for example be constructed from insulating, structurable photoresists or silicon nitride.

The invention will be described in more detail hereinafter with reference to four figures which relate to preferred embodiments of the invention.

FIG. 1 shows a plan view of a bottom electrode layer according to the prior art:

The basic structure of a pixilated detector panel with active matrix activation can be seen, similar to as in the prior art for detectors with inorganic photodiodes. The charge states of the individual pixels are read out line-by-line by switching on all thin-film transistors of a row via the gate lines 12 in each case. Reading-out itself takes place via the source lines 13 of the transistors, so a signal is generated for each pixel of the row just addressed. The signal is proportional to the integrated light intensity since the last read-out or reset cycle.

Figure 3:
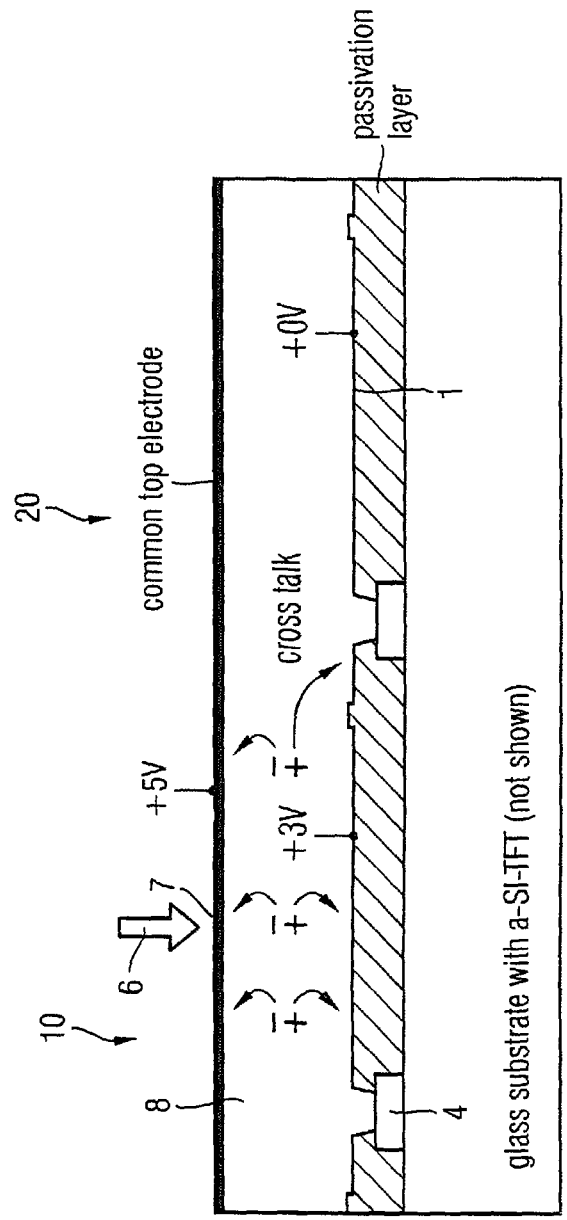

For detector panels with organic photoelectrodes an active matrix activation of this type can analogously be used with thin-film transistors. The active layer of the photodiode which is placed over the thin-film transistor and over the illustrated structured, lower electrodes is then constructed from organic materials. FIG. 3 shows the cross-section of a layer system of this type.

The top electrode 2 is also continuous in the case of an active matrix activation of this type. A bias voltage is typically applied, so an outer driving force exists for the separation of the charge carriers. In FIGS. 3 and 4 a positive voltage is applied by way of example to the top electrode while the electrically isolated bottom electrodes are still at 0 volt in the unilluminated state (as for pixel 20 in FIGS. 3 and 4).

The direction of the used bias voltage always depends on the polarity of the diode.

The left-hand pixel (pixel 10, FIG. 3) is accordingly an illuminated pixel. The charge carriers generated by the light are then conveyed to the two electrodes and the charge state of the capacitor between the two pixel electrodes changes. This change corresponds to discharging of the original bias state, so the bottom electrode is gradually raised to a positive potential, as shown in the figure. The consequence of this is that further generated charge carriers can discharge onto adjacent bottom electrodes 1 where the potential difference between electrodes is even higher. During a subsequent read-out cycle a proportional signal is therefore measured on the adjacent, unilluminated pixels. This problem basically applies to adjacent pixels (10, 20) of a row, adjacent pixels of a column, diagonally adjacent pixels and potentially even to more remote pixels.

Figure 2:
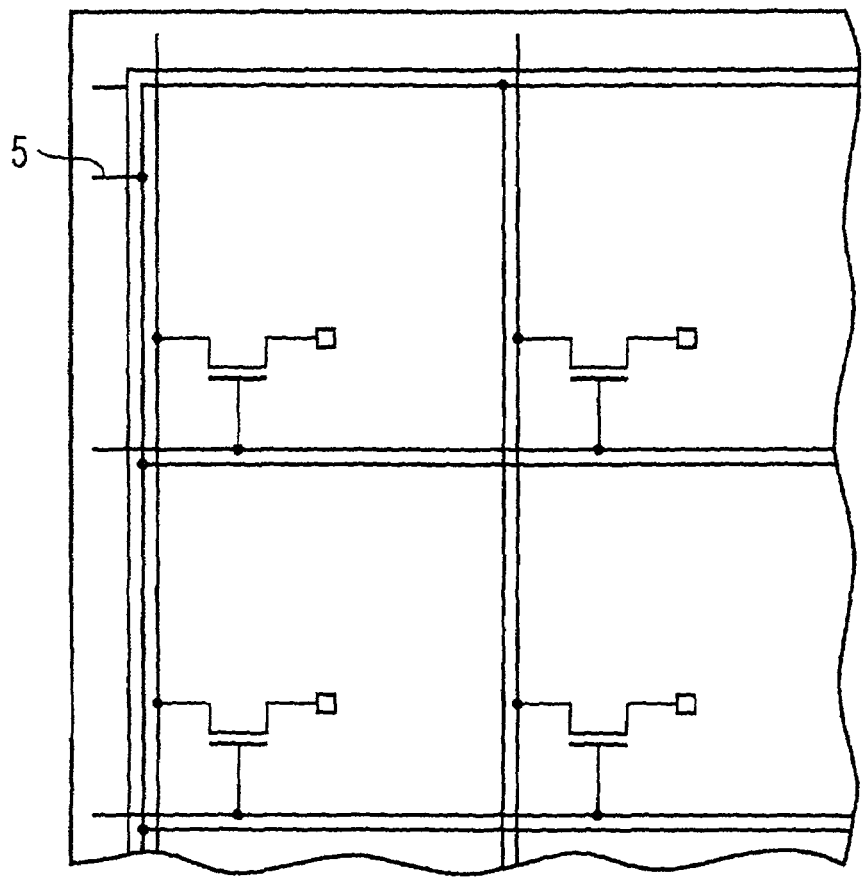

The solution to the problem, proposed in this invention, lies in inserting an additional conductive contact which is arranged in a grid structure between all pixel gaps. This grid can either run next to the source 13 and gate lines 12—as shown in FIG. 2—or be located across these lines (electrically isolated by the passivation layer). A particular advantage of the proposed solution is that the grid-like electrode can be made from the same conductive material as the bottom contact of the diodes, so these electrodes can be structured in the same process step as structuring of the bottom contact. It is only necessary to apply an additional, structured passivation layer over the grid electrode to prevent charge conveying of organic material into this electrode.

As shown in FIG. 4 a positive potential is applied to the grid-like separation electrode, and this prevents the lateral flow of positive charge carriers across this contact. This potential is configured in such a way that the negative charge carriers are nevertheless preferably conveyed to the top electrode although the potential should be higher than on the bottom electrode of a maximally discharged pixel. The exact choice of different potential level depends on the light intensity and on the driver conditions, on the lateral dimensions, the thickness of the semi-conductor material and of the passivation layer above the grid electrode. All signs may also be reversed, as illustrated in the example depicted, as a function of the contacts and therefore the polarity of the photodiode.

The decisive advantage of the disclosed invention is that crosstalk between different illuminated pixels is reduced without structuring of the organic semi-conductor being necessary. Inexpensive process steps such as spin coating, doctoring or printing methods may therefore still be used. The conductive grid electrode can be provided and structured in one step with the bottom electrode of the diodes. The same process may be used for the additional passivation layer above the grid structure as for the passivation layer below the electrode, so the process expenditure increases only slightly overall.

Shown two-dimensionally is the bottom electrode 1, which is structured according to the pixels, so individual pixels can be activated. At the opposing side and still visible only at the edge here is the top electrode 2 which is provided so as to be plane and unstructured. The organic active layer is located therebetween and in the given view is completely covered by the top electrode layer. The top electrode 2 is operated for example with a voltage of 5 volts and the bottom electrode 1 in the unilluminated state with a voltage of 0 volt. The contact point 4 at which feedthrough from the photodiode to the transistor takes place can also be seen.

FIG. 2 shows the same figure but supplemented by the grid electrode 5 according to the invention. In this embodiment the grid electrode is placed over the entire surface of the bottom electrode 1 and in the section illustrated here defines each individual pixel.

Finally, FIG. 3 shows a small section comprising the area of 1¾ pixels and in cross-section a photodiode according to the prior art:

Light falls from above in the direction of arrow 6 onto the top electrode 2 which, for example, may be made from a vapor-deposited semi-transparent layer of metals, such as Ba, Ca, Mg, Al, Ag and combinations or alloys of these metals, salts such as LiF or CsF or indium-tin oxide. The light passes through this semi-transparent layer into the active organic layer where the charge carriers are separated. The charge carriers generated inside the layer are accordingly set in motion at this location and move according to the sign of the charge to the all-over top electrode or to the bottom electrode 1 which is structured according to the individual pixels (pixel 10 and pixel 20).

The feedthroughs 4 to the transistors can also be seen. The insulating passivation layer 11 is situated between the bottom electrode 1 and the substrate 9.

The construction is located on a substrate 9 on which thin film transistors (TFTs) made from amorphous silicon are arranged for activating the pixels.

FIG. 4 finally shows an embodiment according to the invention in which on the one hand the grid electrode 5 is surrounded by the passivation layer 11 and on the other hand separates the pixels 10 and 20 from each other. The grid electrode 5 can also be seen in the pixels adjacent to pixel 10 (for example at pixel 20).

The advantage lies in the introduction of a grid-like, structured electrode between the structured, bottom electrodes of the individual pixels, so a repelling potential prevents conveying of charge carriers to the adjacent bottom electrode.

The decisive advantage of the disclosed invention is that crosstalk between different illuminated pixels is reduced without structuring of the organic semi-conductor being necessary. Inexpensive process steps such as spin coating, doctoring or printing methods may therefore still be used. The conductive grid electrode can be provided and structured in one step with the bottom electrode of the diodes. The same process may be used for the additional passivation layer above the grid structure as for the passivation layer below the electrode, so the process expenditure increases only slightly overall.

For the first time the invention allows suppression of crosstalk without expensive structuring of an active, organic conductive or semi-conductive layer.

This is achieved by the introduction of a grid-like, structured electrode between the structured, bottom electrodes of the individual pixels, so a repelling potential prevents conveying of charge carriers to the adjacent bottom electrode.

The invention claimed is:

1. An electronic component comprising:
    a continuous top electrode;
    a pixilated bottom electrode;
    at least one active, organic semi-conductive or conductive layer embedded between the continuous top and pixilated bottom electrodes as a layer system forming an active region;
    a grid electrode within the layer system, extending across all of the active region and laterally offset from structured parts of the pixilated electrodes, thereby defining an individual pixel or a plurality of pixels; and
    a passivation layer, within the layer system, coating the grid electrode,
    wherein the grid electrode is operated at a voltage which counteracts a charge transfer along the active, organic semi-conductive or conductive layer or crosstalk, of the individual pixels.

2. The component as claimed in claim 1, wherein the component is a photodiode.

3. The component as claimed in claim 1, wherein the grid electrode is made from gold, palladium, chromium, silver, platinum or indium-tin oxide.

4. The component as claimed in claim 1, wherein the grid electrode is substantially angular.

5. The component as claimed in claim 1, wherein the periodicity of the grid is in the range of 50 to 500 μm.

6. The component as claimed in claim 2, wherein the grid electrode is made from gold, palladium, chromium, silver, platinum or indium-tin oxide.

7. The component as claimed in claim 2, wherein the grid electrode is substantially angular.

8. The component as claimed in claim 3, wherein the grid electrode is substantially angular.

9. The component as claimed in claim 2, wherein the periodicity of the grid is in the range of 50 to 500 μm.

10. The component as claimed in claim 3, wherein the periodicity of the grid is in the range of 50 to 500 μm.

11. The component as claimed in claim 1, wherein the periodicity of the grid is in the range of 50 to 500 μm.

12. The component as claimed in claim 4, wherein the periodicity of the grid is in the range of 50 to 500 μm.

\* \* \* \* \*